United States Patent

Son et al.

[11] Patent Number: 5,904,538
[45] Date of Patent: May 18, 1999

[54] METHOD FOR DEVELOPING SHALLOW TRENCH ISOLATION IN A SEMICONDUCTOR MEMORY DEVICE

[75] Inventors: Jeong-Hwan Son, Daejon; Ki-Jae Hoh, Choongcheongbuk-Do, both of Rep. of Korea

[73] Assignee: LG Semicon Co., Ltd, Cheongju, Rep. of Korea

[21] Appl. No.: 08/923,141

[22] Filed: Sep. 4, 1997

[30] Foreign Application Priority Data

Mar. 24, 1997 [KR] Rep. of Korea ................. 1997/10083

[51] Int. Cl.⁶ .................................................. H01L 21/76
[52] U.S. Cl. ......................... 438/424; 438/435; 438/443; 438/447
[58] Field of Search ..................... 438/424–427, 438/430–433, 449–451, 443

[56] References Cited

U.S. PATENT DOCUMENTS

| | | | |
|---|---|---|---|
| 4,523,369 | 6/1985 | Nagakubo | 438/424 |
| 4,534,824 | 8/1985 | Chen | 156/628 |
| 4,570,325 | 2/1986 | Higuchi . | |
| 5,229,316 | 7/1993 | Lee et al. | 438/424 |

*Primary Examiner*—Jey Tsai

[57] ABSTRACT

A method for developing shallow trench isolation in a semiconductor device includes forming an ion diffusion area by implanting fluorine ions where a trench is to be formed in a semiconductor substrate before forming the trench, performing an annealing process or a tilt ion implantation process to diffuse the fluorine ions into both sides corresponding to the upper corners of the trench, wherein the fluorine implantation process increases the oxidation rate of the upper corners of the trench to be more than that of the semiconductor substrate when a light oxidation proceeds for preventing damage to the semiconductor substrate in forming the trench. Accordingly, the upper corner portions of the trench are formed to be rounded so as to distribute an electric field, thereby preventing a hump phenomenon when the completed semiconductor memory device is operated.

24 Claims, 6 Drawing Sheets

METHOD FOR DEVELOPING SHALLOW TRENCH ISOLATION IN A SEMICONDUCTOR MEMORY DEVICE

BACKGROUND OF THE INVENTION

1. Field of the Invention

The present invention relates to a method for developing a shallow trench isolation (hereinafter, called STI) in a semiconductor memory device, and more particularly, to an improved method for forming an upper corner of a trench used to achieve STI in a semiconductor memory device, which is rounded.

2. Description of the Prior Art

Referring to FIGS. 1A through 1H, description of the conventional STI method will now be given in detail.

First, as shown in FIG. 1A, a first oxide film 12 is formed on a semiconductor substrate 11, and a nitride film 13 is formed on the first oxide film 12. Then, as shown in FIG. 2B, a photoresist pattern 14 is formed on the nitride film 13, and the first oxide film 12 and the nitride film 13 are patterned by using the photoresist pattern 14.

Next, as shown in FIG. 1C, the photoresist pattern 14 is removed, and then a trench 15 is formed in the semiconductor substrate 11 by etching the substrate 11 using the patterned nitride film 13 as a hardmask.

Then, as shown in FIG. 1D, by performing a light oxidation, a second oxide film 16 is formed on the inner surface of the trench 15, and, as shown in FIG. 1E, a third oxide film 17 is formed on the entire resultant upper surface by using a high density plasma (HDP) deposition. Here, the trench is filled with the third oxide film 17.

As shown in FIG. 1F, the entire resultant surface of the construction is polished using an apparatus (not illustrated) for a chemical mechanical polishing (CMP). Then, as shown in FIG. 1G, the residual nitride film 13 is removed by etching, and finally, as shown in FIG. 1H, the oxide films 12, 16, 17 are removed by etching, except the portions of the second and third oxide films 16, 17 filled in the trench 15, whereby the conventional STI process of the semiconductor memory device is completed.

As shown in FIG. 1H, the semiconductor structure formed by the conventional STI method has an upper corner portion of 15a of the trench formed in a rectangular construction. Thus, when the completed semiconductor memory device is operated, an electric field is concentrated in the corner portion 15a, resulting in a hump phenomenon.

SUMMARY OF THE INVENTION

It is an object of the present invention to provide an improved method for developing shallow trench isolation (STI) in a semiconductor memory device which is capable of preventing a hump phenomenon when a semiconductor memory device is operated, the present invention generally forming a trench having rounded upper corners.

To achieve the above object, there is provided an improved STI method which includes forming an ion diffusion area by implanting fluorine ions in a semiconductor substrate where a trench is to be formed before forming the trench, performing an annealing process or a tilt ion implantation process to diffuse the fluorine ions into both sides corresponding to the upper corners of the trench, wherein the fluorine implantation process increases the oxidation rate of the upper corners of the trench more than that of the semiconductor substrate when a light oxidation is performed for preventing damage to the semiconductor substrate when forming the trench. Accordingly, the upper corner portions of the trench are formed to be rounded so as to distribute an electric field, thereby preventing a hump phenomenon when the completed semiconductor memory device is operated.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With references to FIGS. 2A through 2H, the method for forming developing STI in a semiconductor memory device according to the present invention will not be described in detail.

Figure 1A:
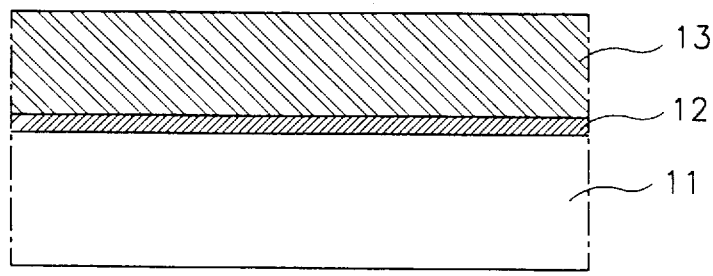
FIGS. 1A through 1H are cross-sectional views showing a method forming developing STI in a semiconductor memory device according to the conventional art.
Figure 1B:
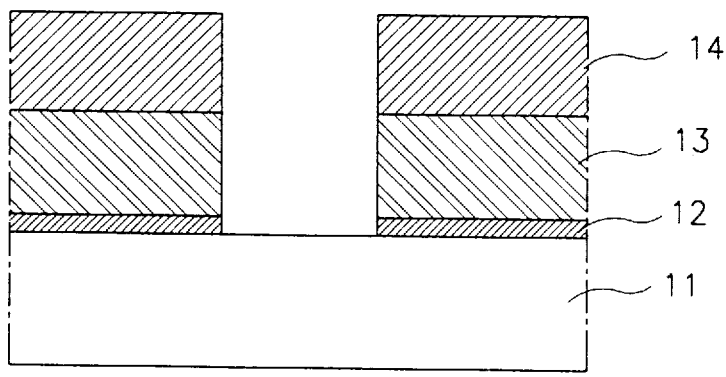
Figure 1C:
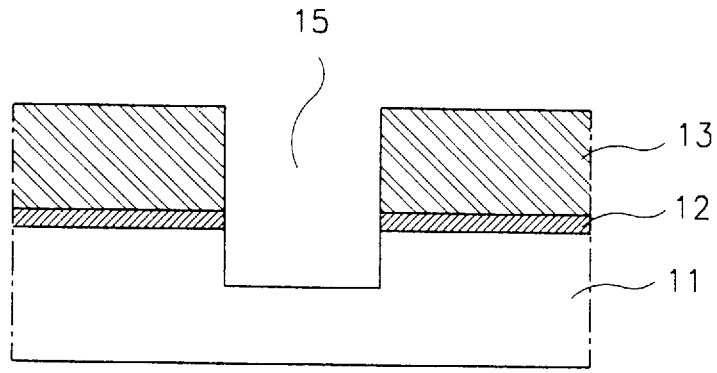
Figure 1D:
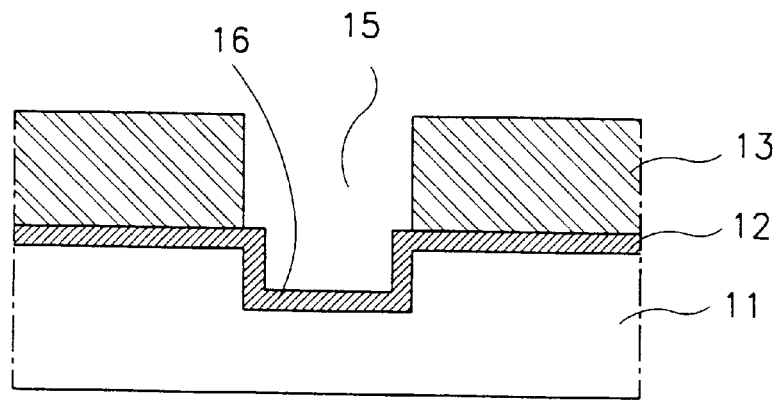
Figure 1E:
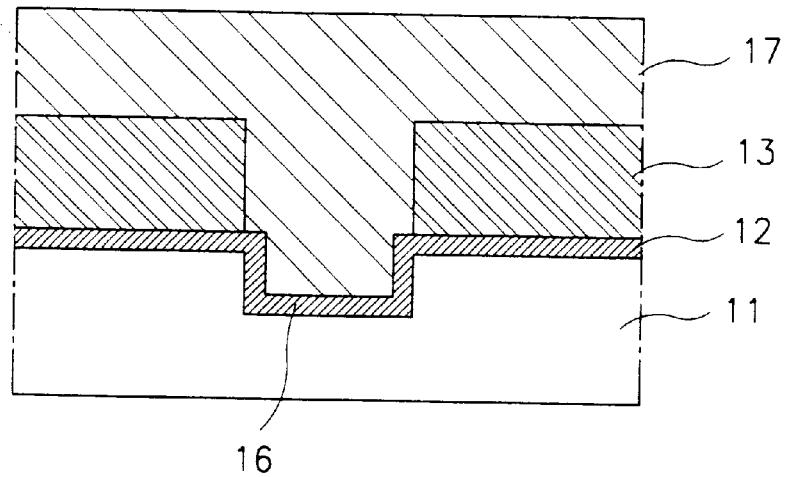
Figure 1F:
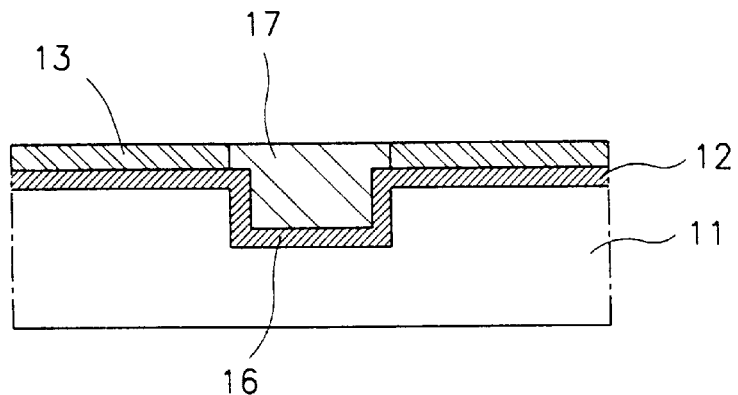
Figure 1G:
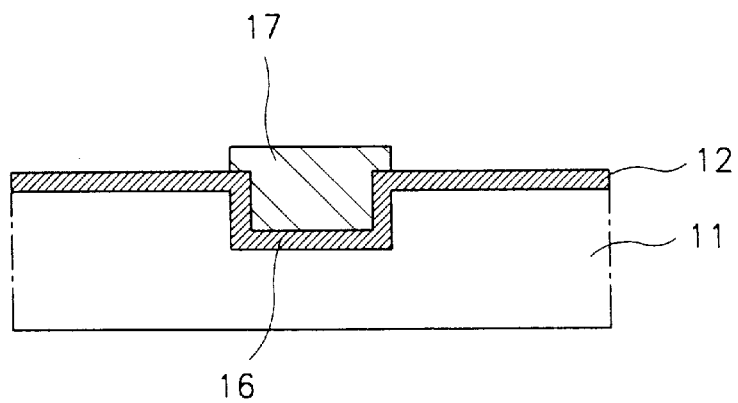
Figure 1H:
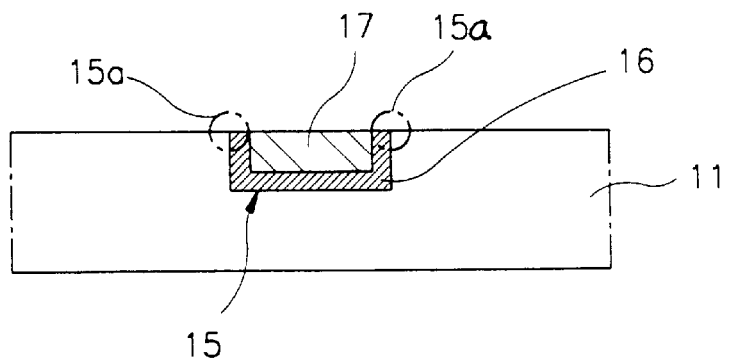
Figure 2A:
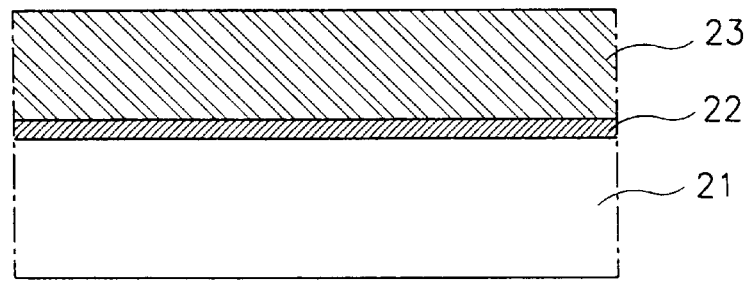
FIGS. 2A through 2H are cross-sectional views showing a method for forming developing STI in a semiconductor memory device according to the present invention.

First, as shown in FIG. 2A, the first oxide film is formed on an upper surface of a semiconductor substrate 21 composed of a silicon, the first oxide film 22 serving as a pad oxide film. A nitride film 23 is then formed on an upper surface of the oxide film 22.

Figure 2B:
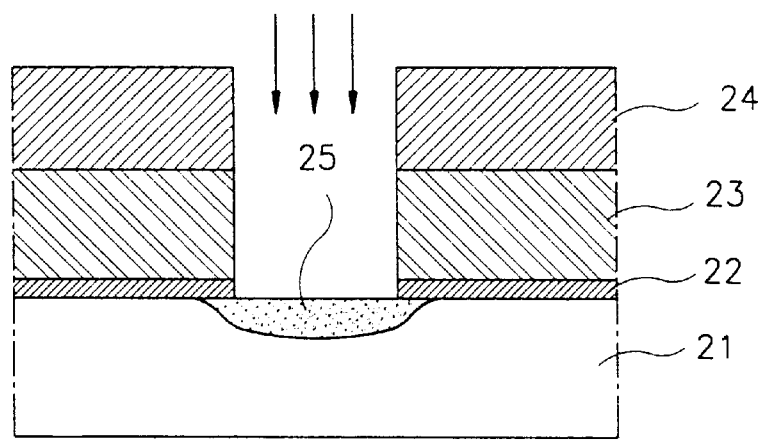

Next, as shown in FIG. 2B, a photoresist pattern 24 is formed on the nitride film 23 which photoresist pattern 24 is used to pattern the nitride film 23 and the first oxide film 22. An ion implantation process is then carried out to from an ion diffusion area 24 at a position within the semiconductor substrate 21 where a trench 26 is to be formed. After the formation of the ion diffusion area 25, an annealing process is further performed so that the ions can be diffused into the semiconductor substrate 21, particularly, in the direction that the upper corner of the trench 26 is to be formed. Alternatively or in concert, a tilt ion implantation may be carried out during the performance of the ion implantation process. Fluorine (F) ions, silicon (Si) ions and/or oxygen (O) ions can be used as the ions in the above process, for the purpose of contaminating a crystal structure of the semiconductor substrate 21.

Figure 2C:
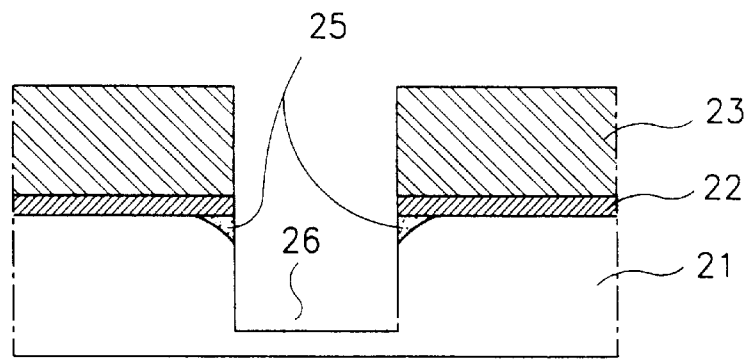

Then, as shown in FIG. 2C, the photoresist pattern 24 is removed, and then the trench 26 is formed in the semiconductor substrate 21 by etching the semiconductor substrate 21 using the patterned nitride film 23 as a hardmask. Here, the ion diffusion area 25 formed in the above step remains on the upper corner portions of the trench 26. Since the residual ion diffusion area 25 has the contaminated crystal structure, an oxidation rate of the ion diffusion area 25 is increased to exceed the oxidation rate of the semiconductor substrate 21 in the performance of a subsequent light oxidation process.

Figure 2D:
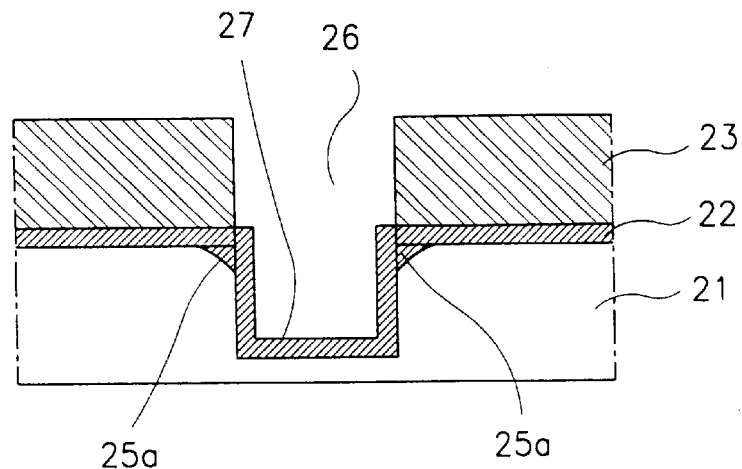
Figure 2E:
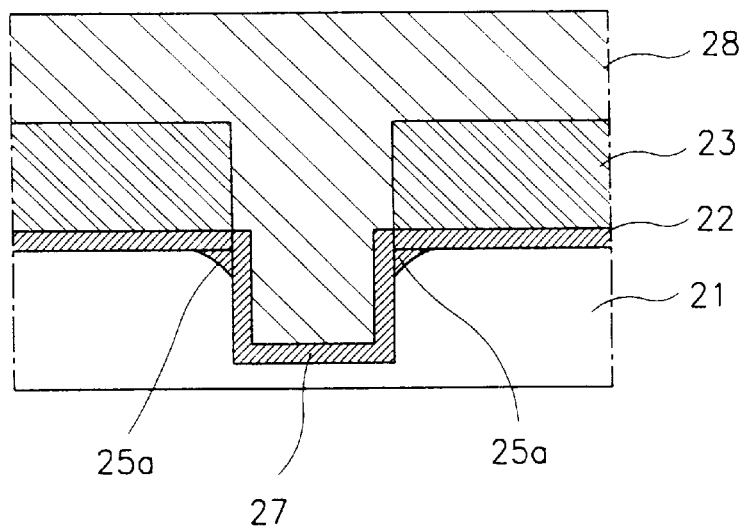

Next, as shown in FIG. 2D, the light oxidation process is performed to form a second oxide film 27 on the inner surface of the trench 26. During the formation of the second oxide film 27, the residual portion of the ion diffusion area 25 is oxidized to form an oxide film 25a having a quality identical to that of the second oxide film 27. As a result, the upper corners of the trench 26 are formed to be round. As shown in FIG. 2E, a third oxide film 28 is formed on the resultant entire surface by using a high density plasma (HDP) deposition. Here, the trench 26 is filled with the third oxide film 28.

Figure 2F:
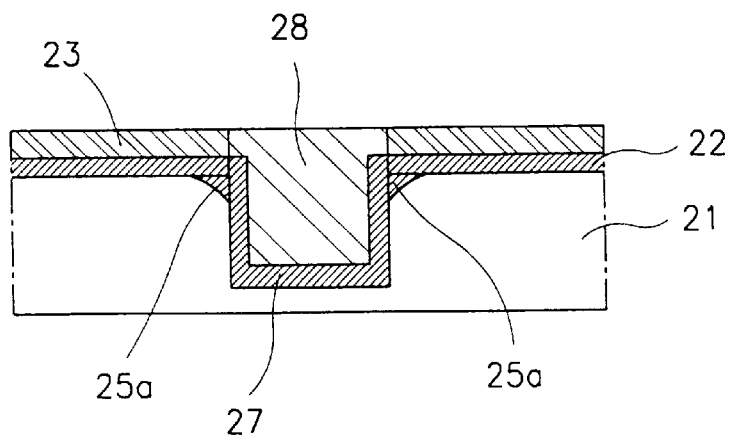
Figure 2G:
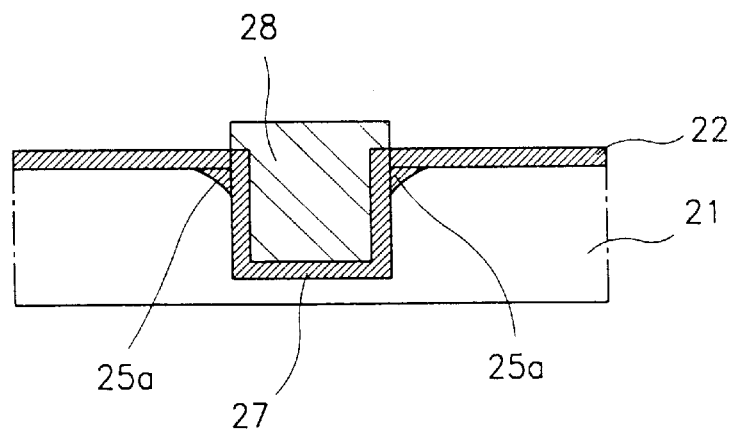
Figure 2H:
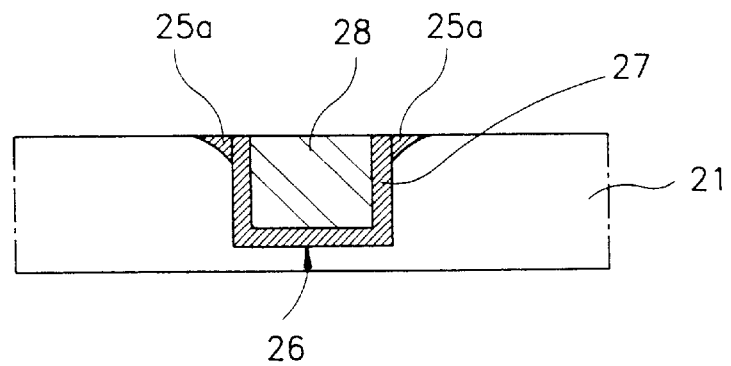

Then, as shown in FIG. 2F, the entire resultant surface of the construction is polished using an apparatus (not illustrated) for a CMP, and, as shown in FIG. 2G, the residual nitride film 23 is removed by etching. Finally, as shown in FIG. 2H, an etching process is performed to remove the portions of the oxide films 22, 27 and 28, not including the oxide film 24a formed by the oxidation of the second and third oxide films 27 and 28 filled in the trench 26 and the ion diffusion area 25, thereby completing the STI process of a semiconductor memory device according to the present invention.

The present invention is not limited to the specific embodiment described with reference to FIGS. 2A through 2H. Rather, various modifications, additions and substitutions are possible, without departing from the scope and spirit of the present invention. For example, in performing an etching process for forming the trench 26, the sequential construction of the first oxide film 22 and the nitride film 23 utilized as a hardmask can be replaced by that of an oxide film/a polysilicon film or an oxide film/a polysilicon film/a nitride film.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for developing shallow trench isolation in a semiconductor memory device, comprising:
   forming a first oxide film on an upper surface of a semiconductor substrate;
   forming a nitride film on the first oxide film;
   forming a photoresist pattern on the nitride film;
   patterning the nitride film and the first oxide film using the photoresist pattern;
   forming an ion diffusion area in a region of the semiconductor substrate where a trench is to be formed;
   removing the photoresist pattern;
   forming a trench in the semiconductor substrate using the patterned nitride film as a mask;
   forming an oxide region by oxidizing a residual portion of the ion diffusion area remaining after forming the trench and a second oxide film on an inner surface of the trench;
   forming a third oxide film on the entire resultant structure;
   polishing an upper surface of the entire resultant structure;
   removing the nitride film remaining after the polishing process; and
   removing a portion of the first, second and third oxide films except the portions of the second and third oxide films filled in the trench.

2. The method of claim 1, wherein after forming the ion diffusion area, an annealing process is further carried out.

3. The method of claim 1, wherein the ions used to form the ion diffusion area are selected from the group consisting of fluorine ions, silicon ions, and oxygen ions.

4. The method of claim 1, wherein the ion diffusion area is formed by employing a tilt ion implantation.

5. The method of claim 1, wherein the trench is formed by etching.

6. The method of claim 1, wherein the second oxide film is formed by performing a light oxidation.

7. The method of claim 1, wherein the oxide region in the residual portion of the diffusion area is formed by oxidizing a portion of the ion diffusion area remaining after the trench is formed, the oxidizing being formed when the second oxide film is formed.

8. The method of claim 1, wherein the third oxide film is formed by a high density plasma deposition.

9. The method of claim 1, wherein the nitride film remaining after the polishing process is removed by etching.

10. The method of claim 1, wherein a polysilicon film is formed instead of the nitride film.

11. The method of claim 10, wherein a nitride film is formed on an upper surface of the polysilicon film.

12. A method for developing shallow trench isolation in a semiconductor memory device, comprising:
    forming a first insulating film on an upper surface of a semiconductor substrate, an exposed surface of the semiconductor substrate being defined on a portion of the semiconductor substrate on which the first insulating film is not formed;
    forming an ion diffusion area by implanting ions in the exposed surface of the semiconductor substrate;
    forming a trench in the exposed surface of the semiconductor substrate;
    forming a second insulating film in the trench by performing an oxidation process;
    forming an oxide region by oxidizing the residual ion diffusion area remaining after the trench is formed;
    forming a third insulating film to fill the trench; and
    performing a polishing process to remove any portions of the first, second and third insulating films not within the trench.

13. The method of claim 12, further comprising:
    an annealing process performed after forming the ion diffusion area.

14. The method of claim 12, wherein the ions implanted in the exposed surface of the semiconductor substrate are selected from the group consisting of fluorine ions, silicon ions, and oxygen ions.

15. The method of claim 12, wherein the ion diffusion area is formed by carrying out a tilt ion implantation.

16. The method of claim 12, wherein forming an oxide region in the ion diffusion area remaining after the trench is formed comprises simultaneously oxidizing exposed portions of the ion diffusion area after the trench is formed.

17. The method of claim 12, wherein the first insulating film is formed of a nitride film.

18. The method of claim 12, wherein the second insulating film is formed of an oxide film.

19. The method of claim 12, wherein the third insulating film is formed by a HDP deposition.

20. The method of claim 12, wherein the oxide region formed in the ion diffusion area remaining after the trench is formed has a quality identical to the second insulating film.

21. The method of claim 12, wherein forming the first insulating film comprises:
    forming the first insulating film on the entire upper surface of the semiconductor substrate; and
    removing a portion of the first insulating film corresponding to a portion of the semiconductor substrate where a device isolation region is to be formed;
    wherein the ion diffusion area is formed after the portion of the first insulating film is removed.

22. The method of claim 7, wherein the oxide region formed in the residual portion of the diffusion area has a quality identical to the second oxide film.

23. A method for developing shallow trench isolation in a semiconductor memory device, comprising:

forming an ion diffusion area by implanting ions in an exposed surface of the semiconductor substrate;

forming a trench in the exposed surface of the semiconductor substrate;

forming a second insulating film in the trench;

forming an oxide region by oxidizing the ion diffusion area remaining after the trench is formed;

forming a third insulating film to fill the trench; and performing a polishing process to remove any portions of the first, second and third insulating films not within the trench.

24. The method of claim 23, wherein the oxide region has a quality identical to the second insulating film.

* * * * *